(12) United States Patent
Eskridge

(10) Patent No.: US 8,129,801 B2
(45) Date of Patent: Mar. 6, 2012

(54) DISCRETE STRESS ISOLATOR ATTACHMENT STRUCTURES FOR MEMS SENSOR PACKAGES

(75) Inventor: Mark H. Eskridge, Renton, WA (US)

(73) Assignee: Honeywell International Inc., Morristown, NJ (US)

( * ) Notice: Subject to any disclaimer, the term of this patent is extended or adjusted under 35 U.S.C. 154(b) by 1010 days.

(21) Appl. No.: 11/326,916

(22) Filed: Jan. 6, 2006

(65) Prior Publication Data

US 2007/0170525 A1 Jul. 26, 2007

(51) Int. Cl.
*H01L 23/10* (2006.01)
(52) U.S. Cl. .............. 257/415; 257/704; 257/E23.193
(58) Field of Classification Search .............. 257/414, 257/415, 416, 417, 418, 419, 420, 688, 689, 257/690, 692, 698, 704, E23.001, E23.002, 257/E23.01, E23.011, E23.012, E23.014, 257/E23.015, E23.023, E23.18, E23.193, 257/E23.194; 438/50, 51, 52, 53
See application file for complete search history.

(56) References Cited

U.S. PATENT DOCUMENTS

| | | | |
|---|---|---|---|
| 4,945,765 A | 8/1990 | Roszhart | |
| 5,006,487 A | 4/1991 | Stokes | |
| 5,177,579 A * | 1/1993 | Jerman | 73/724 |
| 5,273,939 A * | 12/1993 | Becker et al. | 438/48 |
| 5,814,554 A * | 9/1998 | De Samber et al. | 438/611 |
| 6,028,332 A | 2/2000 | Kano et al. | |
| 6,167,761 B1 * | 1/2001 | Hanzawa et al. | 73/724 |
| 6,249,073 B1 | 6/2001 | Nguyen et al. | |
| 6,257,059 B1 | 7/2001 | Weinberg et al. | |
| 6,294,400 B1 * | 9/2001 | Stewart et al. | 438/52 |
| 6,424,074 B2 | 7/2002 | Nguyen et al. | |
| 6,465,854 B1 * | 10/2002 | Muenzel et al. | 257/417 |
| 6,490,147 B2 | 12/2002 | Yoon et al. | |
| 6,509,620 B2 * | 1/2003 | Hartwell et al. | 257/415 |
| 6,566,786 B2 | 5/2003 | Nguyen | |
| 6,569,754 B2 | 5/2003 | Wong et al. | |
| 6,577,040 B2 | 6/2003 | Nguyen | |
| 6,593,831 B2 | 7/2003 | Nguyen | |
| 6,600,252 B2 | 7/2003 | Nguyen | |
| 6,628,177 B2 | 9/2003 | Clark et al. | |
| 6,667,558 B2 | 12/2003 | Wong et al. | |
| 6,680,660 B2 | 1/2004 | Nguyen | |
| 6,713,938 B2 | 3/2004 | Nguyen | |
| 6,739,190 B2 | 5/2004 | Hsu et al. | |
| 6,910,379 B2 | 6/2005 | Eskridge et al. | |
| 6,930,368 B2 * | 8/2005 | Hartwell et al. | 257/418 |
| 2004/0041248 A1 | 3/2004 | Harney et al. | |
| 2004/0065932 A1 * | 4/2004 | Reichenbach et al. | 257/415 |
| 2004/0129989 A1 * | 7/2004 | Zerbini et al. | 257/418 |
| 2005/0037534 A1 | 2/2005 | Sawyer | |
| 2005/0167795 A1 * | 8/2005 | Higashi | 257/678 |
| 2005/0189635 A1 | 9/2005 | Humpston et al. | |

* cited by examiner

Primary Examiner — Samuel Gebremariam
Assistant Examiner — Andrew O Arena
(74) Attorney, Agent, or Firm — Lowe Graham Jones PLLC

(57) ABSTRACT

A discrete stress isolation apparatus for a Micro Electro-Mechanical System (MEMS) inertial sensor device having a mechanism die and a package. A capacitive device mechanism is formed in a substrate layer positioned between the mechanism die and package substrate. A discrete stress isolation structure is formed in the same substrate layer with but physically separated from the capacitive device mechanism. The discrete stress isolation structure is interposed between the mechanism die and the package substrate and provides the mechanical and electrical attachment therebetween.

11 Claims, 4 Drawing Sheets

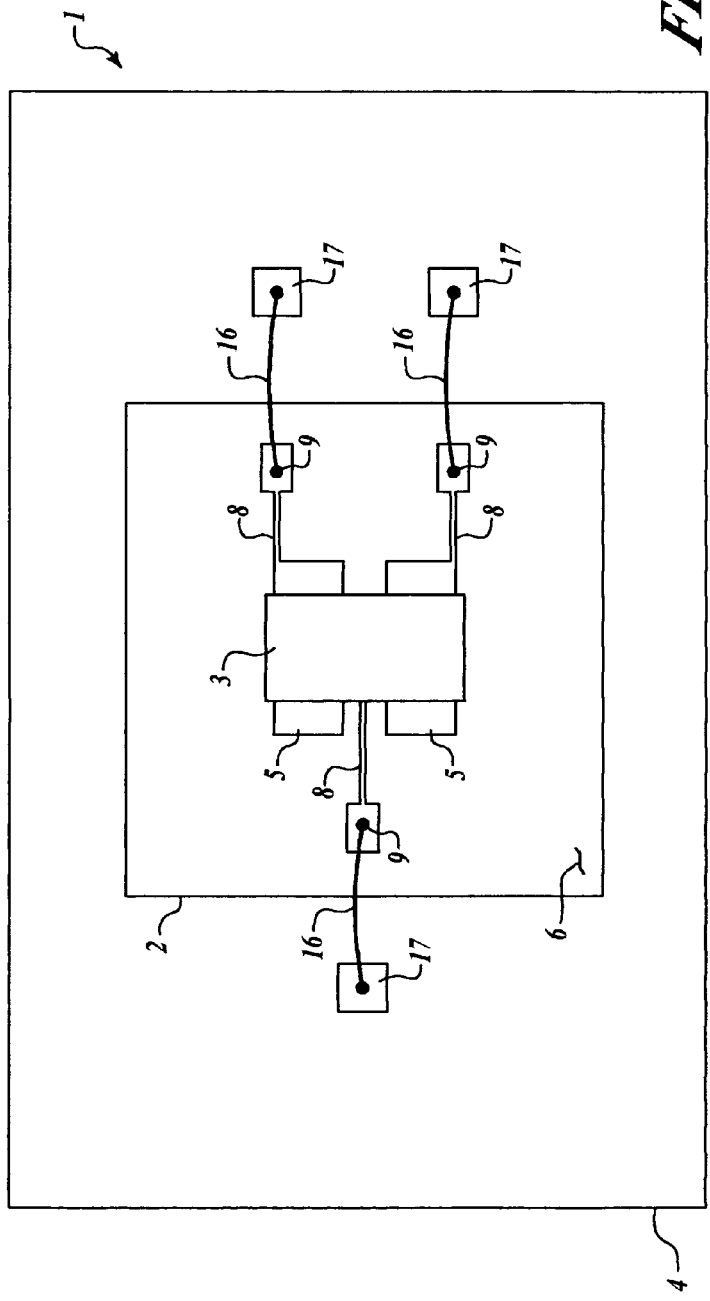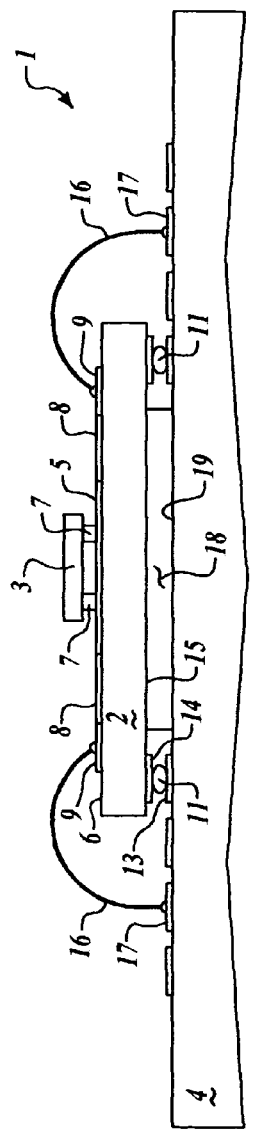

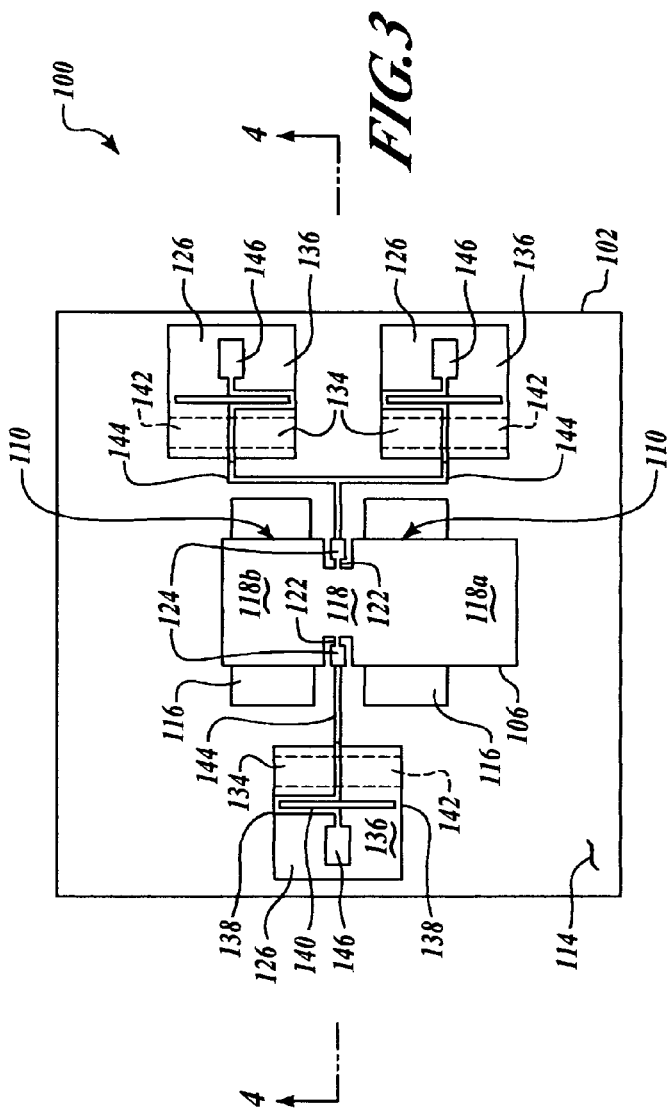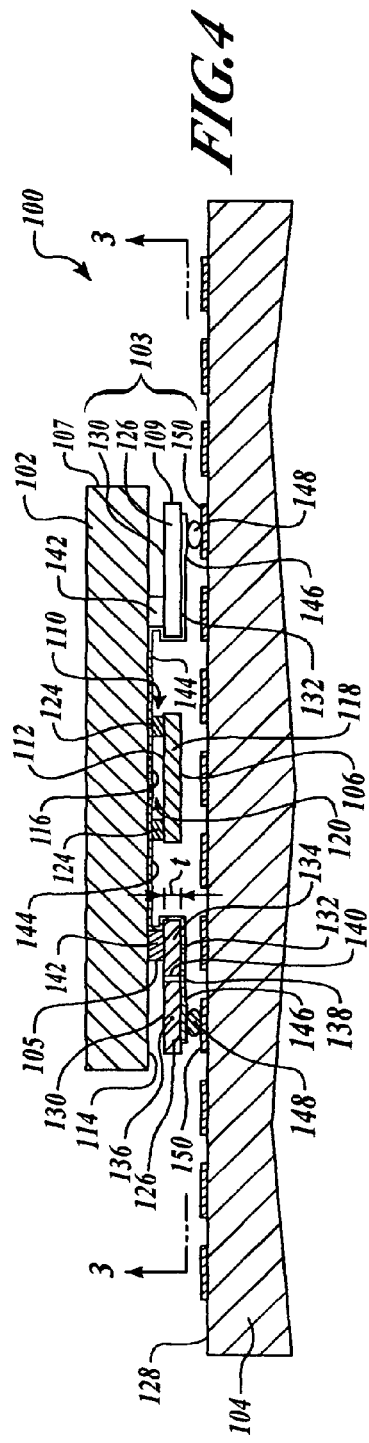

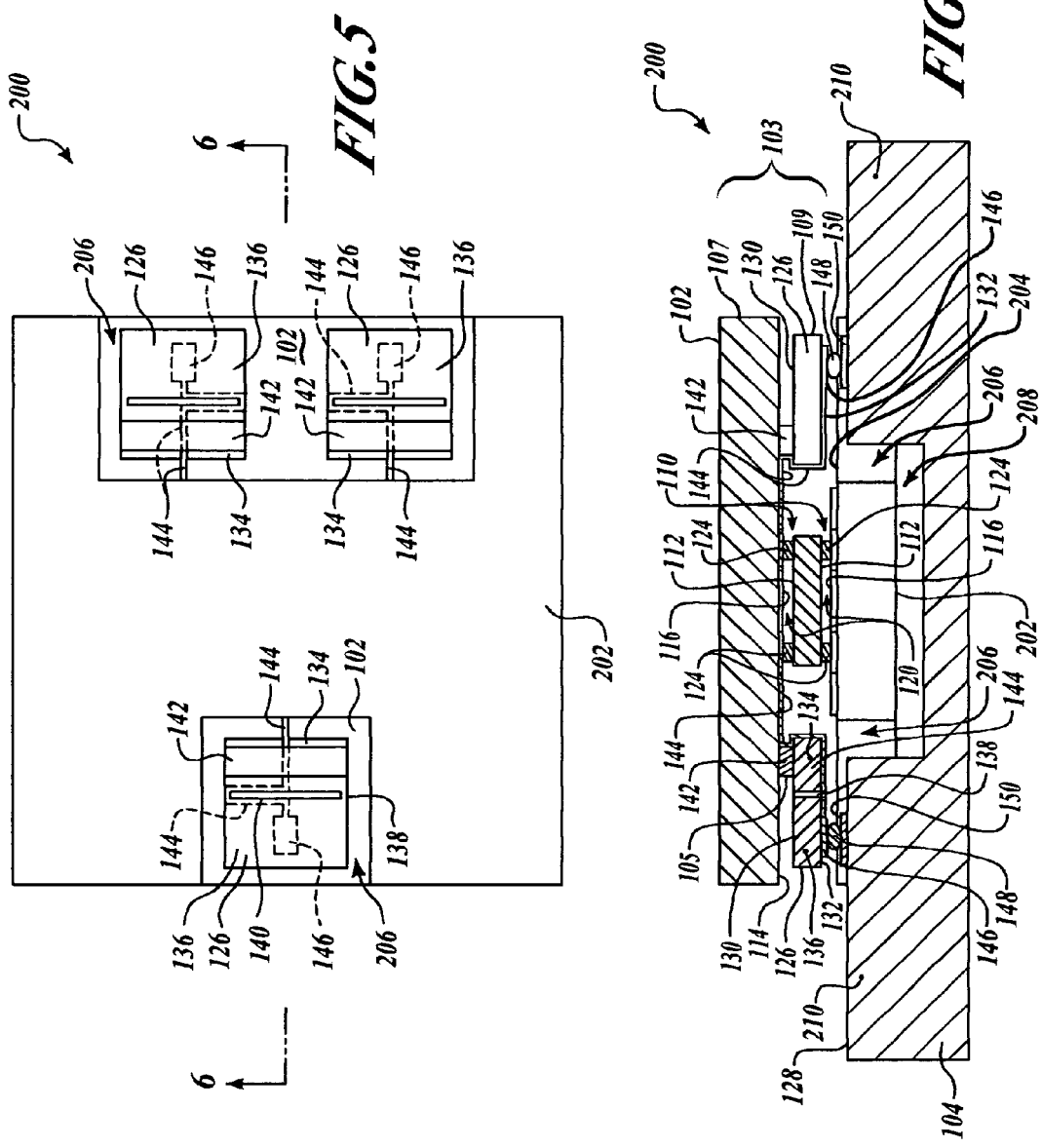

DISCRETE STRESS ISOLATOR ATTACHMENT STRUCTURES FOR MEMS SENSOR PACKAGES

FIELD OF THE INVENTION

The present invention relates to packaging of sensor devices and methods, and in particular to isolation structures for packaging of Micro Electro-Mechanical System (MEMS) sensor devices.

BACKGROUND OF THE INVENTION

Micro Electro-Mechanical System (MEMS) inertial sensors, including accelerometers, gyroscopes and magnetometers, are generally well-known and commercially available from Honeywell International, Incorporated, the assignee of the present patent application. MEMS inertial sensor device mechanisms are formed of a thin (20-200 um) layer of silicon mounted on a borosilicate glass or silicon die. In turn, the MEMS sensor die are typically mounted in a separate package substrate formed of a disparate material, such as ceramic or plastic. These disparate package materials can have coefficients of thermal expansion (CTE's) twice to many times that of the glass or silicon die material. Because die mounting is necessarily accomplished at a high temperature, stresses on the die during cooling to room temperature cause the package to squeeze the die, which results in bias and other performance irregularities and may even cause irreparable damage. Often in operation the device mechanism will also experience stresses due to vibration and shock, which can also cause damage, even catastrophic damage.

MEMS inertial sensor device mechanisms are created using reactive ion etching (RIE) or deep reactive ion etching (DRIE) which both etch very small features through an entire mechanism layer. These processes permit the creation of intricately shaped structures in the x-y plane of the thin mechanism layer, but do not permit control in the z direction other than depth, rather akin to an intricate cookie cutter. The device mechanism may be attached to the die at any point or cut free to move in response to external inputs.

Isolation of MEMS inertial sensor device mechanisms from the package substrate has typically taken the form of isolation materials beneath the mechanism die with the isolation material having a CTE near that of the die or the substrate, or between the CTE's of the die and the substrate.

FIG. 1 and FIG. 2 are top and side views, respectively, that illustrate the isolation mechanism typical of the prior art. In a conventional MEMS capacitance readout inertial sensor device 1, mechanism die 2 are typically mounted "face up," with a device mechanism 3 (or "mechanism device", used interchangeably hereinafter) positioned on top of the die 2, i.e., opposite from the package substrate 4. The device mechanism 3 is spaced above the die 2 over capacitor plates 5 formed on the upper die surface 6. The device mechanism 3 is, by example and without limitation, attached through anchors 7 to the upper die surface 6. Electrically conductive paths or metallized traces 8 are led from the capacitor plates 5 and device mechanism 3 to wire bond pads 9 on the upper die surface 6.

The mechanism die 2 is attached to the package substrate 4, by example and without limitation, using gold, aluminum or solder stud bumps 11 between bond pads 13 and 14 formed respectively on the package substrate 4 and a lower die surface 15. Thereafter, electrical contact is made between the mechanism die 2 and the package substrate 4 by electrically conductive wires 16 bonded between the wire bond pads 9 and wire bond pads 17 formed on the package substrate 4.

Isolation of the MEMS inertial sensor device mechanism 1 from the package substrate 4 is typically provided by isolation material 18 positioned between the lower die surface 15 and an upper the surface 19 of substrate 4, the isolation material 18 having a CTE near that of either the die 2 or the substrate 4, or between the CTE's of the die 2 and the substrate 4.

While such isolation mechanisms based upon isolation materials interposed between the die and substrate are effective for many applications, they still represent a difference in CTE that may result in bias and other performance irregularities in sensitive devices.

SUMMARY OF THE INVENTION

The present invention is a Micro Electro-Mechanical System (MEMS) inertial sensor device having a discrete stress isolation structure. The apparatus of the present invention includes a mechanism die and a package. The apparatus of the present invention is equally useful in applications where the mechanism die and package substrate are formed of different materials having substantially different coefficients of thermal expansion (CTE). The mechanism die and package substrate are spaced apart and substantially parallel with one another. A capacitive device mechanism is attached to the mechanism die between the mechanism die and package substrate. The device mechanism is spaced away from the surface of the mechanism die facing toward the package substrate and is attached thereto through one or more anchors. The mechanism die is positioned with the device mechanism facing toward the package substrate and spaced away therefrom. Multiple discrete stress isolation structures are interposed between the mechanism die and the package substrate for spacing the device mechanism away from the package substrate. The mechanism die is electrically and mechanically coupled through metallized bond pads on the respective isolation structures to metallized bond pads provided on the surface of the package substrate.

According to one aspect of the invention, electrical and mechanical coupling between the metallized bond pads on the respective isolation structures and the metallized bond pads provided on the surface of the package substrate is accomplished using conventional gold stud bump flip chip (GSBFC) techniques.

According to another aspect of the invention, the capacitive device mechanism includes a moveable portion that is structured for measuring differential capacitance, the moveable portion being structured for motion either in the plane of the device mechanism, or out-of-plane in response to an external input.

According to another aspect of the invention, the capacitive device mechanism includes a moveable portion positioned over one or more capacitor plates formed on the opposing surface of the mechanism die for measuring differential capacitance in response to motion caused by an external input.

According to another aspect of the invention, the sensor device optionally includes a cover plate attached over the capacitive device mechanism, whereby the capacitive device mechanism is optionally a two-sided device mechanism. According to this aspect of the invention, the cover plate is structured with apertures positioned for clearance of the stress isolation structures of the invention. Additionally, the package substrate is formed with clearance apertures structured to accommodate the cover plate. Furthermore, the package substrate is formed with fingers extending into the clearance apertures and positioned to correspond to the stress isolation structures and including the metallized bond pads on their surfaces.

According to still other aspects of the invention, methods are provided for forming the sensor device of the invention of a base wafer having an insulation layer between a relatively thicker handle layer and a relatively thinner active layer, the mechanism die being formed in the handle layer, the mechanism device being formed in the active layer, the anchors attaching the mechanism device to the mechanism die, the discrete stress isolation structures being formed in the active layer independently of and separate from the mechanism device and being attached to the mechanism die by one or more anchors formed between the isolation structures and the mechanism die. The method including forming electrically conductive pathways between the mechanism device and one or more of the isolation structures, and attaching the mechanism die to the package substrate by forming one or more metallized bond pads on a surface of the isolation structures facing toward the surface of the package substrate, and attaching the isolation structures to the electrical interface pads on the surface of the package substrate by attaching one or more of the metallized bond pads on the surface of the isolation structures to a corresponding one of the electrical interface pads on the surface of the package substrate.

According to another aspect of the method of the invention, the attaching of one or more of the metallized bond pads on the surface of the isolation structures to a corresponding one of the electrical interface pads on the surface of the package substrate is accomplished by forming one or more stud bumps between the metallized bond pad on the surface of the isolation structures and the corresponding electrical interface pad on the surface of the package substrate.

According to another aspect of the method of the invention, the method includes attaching a cover plate to the mechanism device opposite from the mechanism die, including forming the cover plate with one or more apertures sized to provide clearance around each of isolator structures; forming a clearance aperture in the package substrate, including structuring the clearance aperture to accommodate the cover plate; and nesting the cover plate in the clearance aperture in the package substrate.

According to another aspect of the method of the invention, the method includes structuring the clearance aperture in the package substrate to accommodate the cover plate by forming one or more fingers within the clearance aperture positioned to interface with the isolation structures, the fingers forming the surface of the package substrate having the electrical interface pads formed thereon.

Other features and advantages of the invention will appear from the following description in which the preferred embodiment has been set forth in detail in conjunction with the accompanying drawings.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 is a top view of a MEMS capacitance readout inertial sensor device of the prior art;

FIG. 2 is side view of the MEMS inertial sensor package of the prior art, including the MEMS capacitance readout inertial sensor device shown in FIG. 1;

FIG. 3 is a bottom plan view that illustrates the discrete stress isolator structures of the invention in combination with a Micro Electro-Mechanical System (MEMS) inertial sensor device having a package substrate portion removed for clarity;

FIG. 4 is a cross-sectional view of the miniature MEMS inertial sensor package of the invention having a MEMS sensor device of FIG. 3 including the package substrate portion;

FIG. 5 is a bottom plan view that illustrates the discrete stress isolator structures of the invention in combination with an alternative MEMS inertial sensor device having a package substrate portion removed for clarity;

FIG. 6 is a cross-sectional view of the miniature MEMS inertial sensor package of the invention having a MEMS sensor device of FIG. 5 including the package substrate portion.

DETAILED DESCRIPTION OF PREFERRED EMBODIMENT

Figure 7:
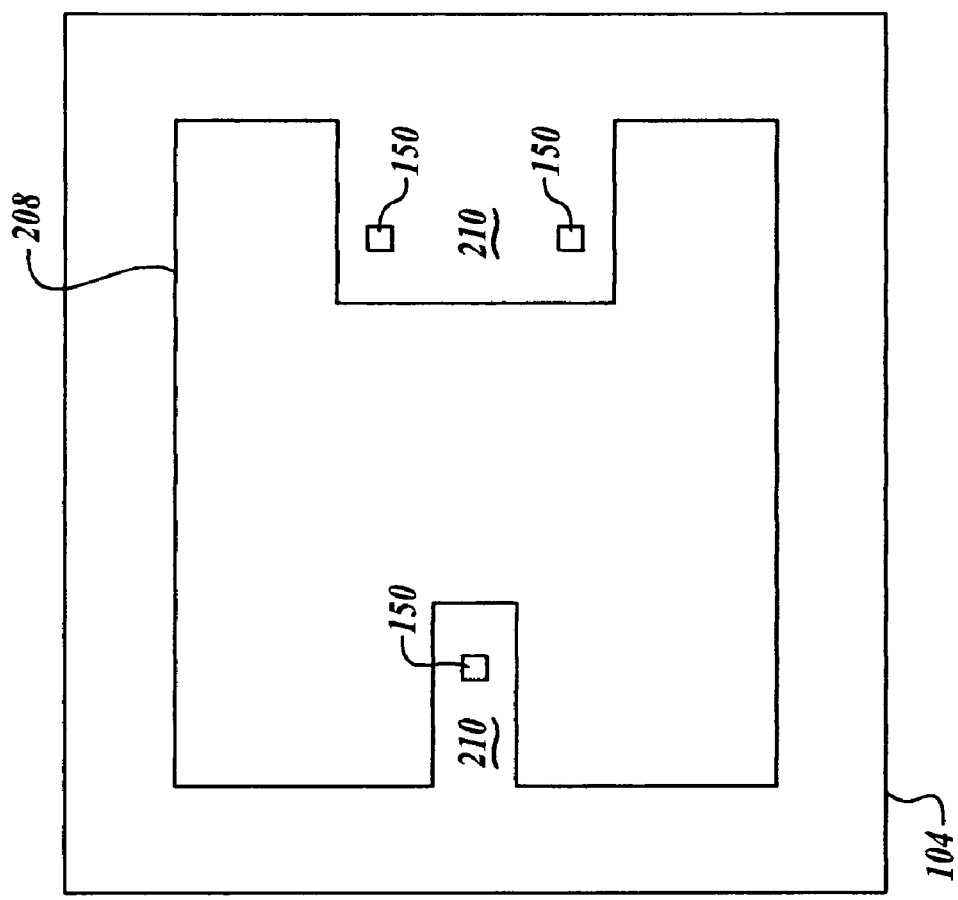
FIG. 7 illustrates the alternative package substrate of FIG. 6 as being provided with clearance aperture sized to clear the outline of a cover plate over the sensor mechanism.

In the Figures, like numerals indicate like elements.

FIG. 3 is a bottom plan view that illustrates the discrete stress isolator structures of the invention in combination with a Micro Electro-Mechanical System (MEMS) inertial sensor device 100 wherein the package substrate is removed for clarity, and FIG. 4 is a side cross-section view taken through the MEMS inertial sensor device 100 illustrated in FIG. 3. MEMS inertial sensor device 100 includes a mechanism die 102 and a package substrate 104 each formed of different materials having substantially different coefficients of thermal expansion (CTE). For example, mechanism die 102 is usually formed of borosilicate glass or silicon, while the separate package substrate is formed of a disparate material, typically ceramic or plastic.

Mechanism die 102 and mechanism device 106 are formed, for example, of a Silicon-on-Insulator (SOI) base wafer 103 which is a SOI base wafer having a buried dielectric or insulation layer 105 of only a few microns thickness that is sandwiched between and substantially contiguous with a relatively thicker "handle" layer 107 and a relatively thinner "active" layer 109. For example, active layer 109 typically formed of a thin (20-200 microns) layer of silicon mounted or grown on insulation layer 105 over handle layer 107 using well-known conventional methods. Handle and active layers 107, 109 are both formed of single crystal silicon (SCS) semiconductor material. The SOI base wafer 103 is of a type that is generally commercially available. Alternatively, handle layer 107 is an insulating base wafer, such as a borosilicate glass wafer, and active layer 109 is a SCS or SOI device wafer mounted on handle layer 107. Mechanism die 102 is formed in handle layer 107, and mechanism device 106 is formed in active layer 109.

Device mechanism 106 is attached, that is mechanically and electrically coupled to mechanism die 102 through insulation layer 105, but may be partly cut free to move in response to external inputs, as illustrated. By example and without limitation, device mechanism 106 is a MEMS inertial sensor device mechanism 106 such as capacitive device mechanism structured for measuring differential capacitance in response to an external input. When structured as a MEMS inertial sensor mechanism, device mechanism 106 may be arranged relative to mechanism die 102 for forming multiple capacitors 110 for measuring differential capacitance therebetween. Accordingly, one surface 112 of device mechanism 106 is arranged substantially parallel with and spaced away from a first surface 114 of mechanism die 102 and positioned one or more capacitor plates 116 provided on first surface 114, thereby forming the one or more capacitors 110 between surface 112 of device mechanism 106 and capacitor plates 116.

For example, a movable portion 118 of mechanism device 106 is spaced away from mechanism die 102 by capacitive air gap 120, whereby capacitors 110 are formed there between. Capacitive air gap 120 is formed between device mechanism 106 and mechanism die 102 by, for example, selective etching of dielectric or insulation layer 105 using conventional micromachining processes that are well-known in the art as disclosed. See, for example, co-pending U.S. patent application Ser. No. 11/084,978 for "Method of Manufacturing Vibrating Micromechanical Structures," filed in the names of Ijaz H. Jafri and Jonathan L. Klein on Mar. 21, 2005, which is incorporated herein by reference and is co-owned by the assignee of the present application.

Moveable portion 118 is supported on one or more flexures 122 which are connected to mechanism die 102 through anchors 124. Moveable portion 118 is thus free to move out of plane for measuring differential capacitance between first and second teeter-totter portions 118a, 118b of moveable portion 118 positioned on opposite sides of flexures 122.

Alternatively, mechanism device 106 is fashioned as an in-plane comb-type capacitive readout force transducer with multiple differential capacitors formed between intermeshing moving comb teeth on moveable portion 118 of mechanism device 106 and stationary comb teeth on a stationary portion. For example, in-plane mechanism device 106 is of a type disclosed, by example and without limitation, in U.S. Pat. No. 6,910,379 for "Out-of-Plane Compensation Suspension for an Accelerometer," issued to the inventor of the present invention on Jun. 28, 2005, which is incorporated herein by reference and is co-owned by the assignee of the present application.

Multiple discrete stress isolation structures 126 are interposed between mechanism die 102 and package substrate 104 for spacing device mechanism 106 away from a first surface 128 of package substrate 104. Isolation structures 126 are formed in the same layer of silicon as device mechanism 106 and are thus coplanar with the device mechanism 106. However, isolation structures 126 are physically separated from device mechanism 106. Isolation structures 126 are, for example, formed at the same time as forming device mechanism 106 using the same reactive ion etching (RIE) or deep reactive ion etching (DRIE) processes which both etch very small features through the entire isolation structure thickness. As is well-known in the art, these processes permit the creation of intricately shaped structures in the x-y plane of the isolation structure, but do not permit control in the z direction other than depth, rather akin to an intricate cookie cutter. Isolation structures 126 are therefore of substantially constant cross-section through their entire thickness t. Alternatively, device mechanism 106 and isolation structures 126 are formed by conventional wet etching techniques, such as anistropically etching in a suitable etchant, such as potassium hydroxide (KOH). Isolation structures 126 may be formed having intricate shapes, however, they are illustrated here as simple squares or rectangles having substantially planar and mutually parallel spaced apart first and second surfaces 130, 132. Optionally, each of isolation structures 126 includes mutually isolated first and second portions 134, 136 linked by one or more flexures 138. By example and without limitation, first and second mutually isolated portions 134, 136 are spaced apart on opposite sides of a gap 140 provided by a slot formed through the entire thickness t of one, two, or all isolation structures 126. First portion 134 is supported by connection to mechanism die 102 through one or more anchors 142. When the handle layer 107 is an insulating base wafer, as discussed herein, anchors 142 are formed in the insulation material, for example, by selective etching using conventional micromachining processes that are well-known in the art as disclosed. Alternatively, when the handle layer 107 is a semiconductor material, anchors 142 are formed, for example, by selective etching in dielectric or insulation layer 105. Electrically conductive pathways 144 provide electrical signal carriers between device mechanism 106 and metallized bond pads 146 located on surfaces 132 of isolation structures 126 opposite from mechanism die 102.

Isolation structures 126 are interposed in a substantially balanced pattern between mechanism die 102 and package substrate 104. For example, as illustrated, three isolation structures 126 are interposed between mechanism die 102 and package substrate 104 in a triangular pattern. Alternatively, more or less than three isolation structures 126 are utilized, for example, four isolation structures 126 are utilized in a square or rectangular pattern, five isolation structures 126 are utilized in a pentagonal pattern, six isolation structures 126 are utilized in a hexagonal pattern, and more isolation structures 126 may be utilized in other balanced pattern.

Attachment of mechanism die 102 is accomplished through isolation structures 126. By example and without limitation, attachment is accomplished using well-known conventional gold stud bump flip chip (GSBFC) techniques. Thus, one or more gold, aluminum or solder stud bumps 148 are formed between metallized bond pads 146 on surfaces 132 of isolation structures 126 and different metallized bond pads 150 provided on first surface 128 of package substrate 104 as a substantial mirror image of metallized bond pads 146 on stress isolation structures 126. Stud bumps 148 thus form electro-mechanical connections between mechanism die 102 and package substrate 104 through isolation structures 126 interposed therebetween.

Mechanism die 102 is thus attached to package substrate 104 with device mechanism 106 arranged therebetween and facing toward but spaced away from first surface 128. Circuitry on surface 128 or within package substrate 104 provide electrical pathways for external electrical connections to mechanism die 102 and device mechanism 106.

FIG. 5 is a bottom plan view that illustrates the discrete stress isolator structures 126 of the invention in combination with an alternative Micro Electro-Mechanical System (MEMS) inertial sensor device 200 wherein package substrate 104 is removed for clarity, and FIG. 6 is a side cross-section view taken through the MEMS inertial sensor device 200 illustrated in FIG. 5. Alternative MEMS inertial sensor device 200 differs from sensor device 100 primarily in that a cover plate 202 is attached and space is provided in package substrate 104 to accommodate cover plate 202. By example and without limitation, cover plate 202 is attached through additional anchors 124 to device mechanism 106 opposite from mechanism die 102, whereby alternative sensor device 200 is a two-sided device having differential capacitors 110 formed between surfaces 112 of mechanism device 106 and capacitor plates 116 formed on respective opposing surfaces 114 of mechanism die 102 and 204 of cover plate 202, as is generally well-known in the art. In prior art devices one of mechanism die 102 and cover plate 202 was used for mounting such a two-sided device. In contrast, in the invention, a pattern of isolation structures 126 is provided for mounting mechanism die 102, as discussed herein above. As illustrated, cover plate 202 is formed similarly in size and shape to mechanism die 102, except cover plate 202 includes one or more apertures 206 sized to provide clearance around each of isolator structures 126.

FIG. 7 illustrates package substrate 104 as being provided with clearance aperture 208 sized to clear the outline of cover plate 202. One or more fingers 210 are provided within aperture 208 to interface with the pattern of isolation structures 126. Metallized bond pads 150 are provided on first surface 128 of package substrate 104 in a substantial mirror image of metallized bond pads 146 on stress isolation structures 126. One or more of gold, aluminum or solder stud bumps 148 are formed between metallized bond pads 146 on surfaces 132 of isolation structures 126 and different metallized bond pads 150. Stud bumps 148 thus form electro-mechanical connections between mechanism die 102 and package substrate 104 through isolation structures 126 interposed therebetween.

While the preferred embodiment of the invention has been illustrated and described, it will be appreciated that various changes can be made therein without departing from the spirit and scope of the invention.

What is claimed is:

1. A Micro Electro-Mechanical System (MEMS) sensor device, comprising: a package substrate;
   a mechanism die spaced away from the package substrate;
   a mechanism device depending from the mechanism die between the mechanism die and the package substrate; and
   one or more discrete isolation structures interposed between the mechanism die and the package substrate, the one or more discrete isolation structures attaching the mechanism die to the package substrate,
   wherein the isolation structures and the mechanism device are composed of substantially the same semiconducting material,
   wherein at least one of the isolation structures further comprises mutually isolated first and second portions spaced apart on opposite sides of a gap, the first and second portions linked by one or more flexures,
   wherein the mechanism die is attached only to the first portion of the isolation structures.

2. The device of claim 1 wherein the isolation structures are connected to the mechanism die through one or more anchors.

3. The device of claim 1, further comprising stud bumps formed between one or more electrical interface pads formed on the isolation structures and one or more electrical interface pads formed on the package substrate.

4. The device of claim 1, further comprising a cover plate attached to the mechanism device opposite from the mechanism die; and
   wherein the package substrate is further structured to accommodate the cover plate.

5. The device of claim 1 wherein the mechanism device further comprises a device structured for measuring differential capacitance between different capacitors.

6. A Micro Electro-Mechanical System (MEMS) sensor device, comprising:
   a package substrate having a plurality of electrical interface pads on a surface thereof;
   a base wafer having a relatively thicker first substrate layer and a relatively thinner second substrate layer;
   a mechanism die formed in the first substrate layer of the base wafer;
   a mechanism device formed in the second substrate layer of the base wafer and depending from the mechanism die through one or more anchors; and
   a plurality of discrete stress isolation structures formed from the second substrate layer of the base wafer independent of the mechanism device and depending from the mechanism die through one or more anchors, the isolation structures being attached to the electrical interface pads on the surface of the package substrate,
   wherein one or more of the discrete stress isolation structures further comprises:
   a first portion attached to the mechanism die through the one or more anchors, and
   a second portion attached to the electrical interface pads on the surface of the package substrate,
   the first and second portions spaced apart on opposite sides of a gap, and the first and second portions linked by one or more flexures.

7. The device of claim 6, further comprising one or more stud bumps attaching the isolation structures to the electrical interface pads on the surface of the package substrate.

8. The device of claim 6, further comprising a cover plate attached to the mechanism device opposite from the mechanism die, the cover plate being formed with one or more apertures sized to provide clearance around each of isolator structures; and
   wherein the package substrate further comprises a clearance aperture structured to accommodate the cover plate.

9. The device of claim 6 wherein the mechanism device further comprises a device structured for measuring differential capacitance between different capacitors.

10. The device of claim 9 wherein the mechanism device further comprises one or more moveable portions structured for motion out of a plane of the mechanism device.

11. The device of claim 9 wherein the mechanism device further comprises one or more moveable portions structured for motion in a plane of the mechanism device.

* * * * *